(12) United States Patent
Kawaura et al.

(10) Patent No.: US 7,863,891 B2
(45) Date of Patent: Jan. 4, 2011

(54) COLLISION DETECTION DEVICE WHICH USES VARIATION OF AN INDUCTANCE OF A COIL

(75) Inventors: Masanori Kawaura, Nukata-gun (JP); Norio Sanma, Okazaki (JP); Kyoujirou Suzuki, Nagoya (JP); Sadayuki Kuwahara, Ichinomiya (JP); Shinichi Kiribayashi, Anjo (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 887 days.

(21) Appl. No.: 11/789,142

(22) Filed: Apr. 24, 2007

(65) Prior Publication Data
US 2007/0246333 A1  Oct. 25, 2007

(30) Foreign Application Priority Data
Apr. 25, 2006  (JP) .............................. 2006-120594

(51) Int. Cl.
*G01B 7/14* (2006.01)
(52) U.S. Cl. ............................ 324/207.16; 324/207.26; 180/274; 340/436; 340/551
(58) Field of Classification Search ................ None
See application file for complete search history.

(56) References Cited

U.S. PATENT DOCUMENTS

| | | | | |
|---|---|---|---|---|
| 3,997,835 A * | 12/1976 | Ando et al. | ............ | 324/207.26 |
| 7,137,472 B2 * | 11/2006 | Aoki | ............ | 180/274 |
| 7,164,349 B2 * | 1/2007 | Kawaura et al. | ............ | 340/435 |
| 7,564,249 B2 * | 7/2009 | Bauer et al. | ............ | 324/713 |
| 2006/0103514 A1 | 5/2006 | Hosokawa | | |
| 2009/0319212 A1 * | 12/2009 | Cech et al. | ............ | 702/65 |

FOREIGN PATENT DOCUMENTS

| | | |
|---|---|---|
| DE | 37 29021 | 3/1989 |
| DE | 42 42 230 | 6/1994 |
| DE | 43 08 353 | 8/1994 |
| DE | 101 20 457 | 10/2002 |
| DE | 10 2004 034 001 | 2/2006 |
| JP | 05-139244 | 6/1993 |
| JP | 07-186878 | 7/1995 |
| JP | 09-175319 | 7/1997 |

OTHER PUBLICATIONS

Office action dated Oct. 26, 2009 in corresponding German Application No. 10 2007 017 496.0.
Office action dated Mar. 10, 2008 in German Application No. 10 2007 017 496.0 with English translation thereof.

\* cited by examiner

*Primary Examiner*—Jay M Patidar
(74) *Attorney, Agent, or Firm*—Harness, Dickey & Pierce, PLC (57) ABSTRACT

A collision detection device is provided with a coil which is arranged at an inner side of an outer panel of a body portion of a vehicle and faces the outer panel to generate a magnetic field in a direction toward the outer panel, and a collision determining unit for determining a collision with the body portion of the vehicle based on a variation of an inductance of the coil. The collision determining unit includes a resonance circuit which is constructed of the coil. When there occurs a collision with the vehicle body portion, a distance between the outer panel and the coil will decrease so that an inductance of the coil can instantly decrease. Therefore, a resonance frequency of the resonance circuit will increase and be detected, thus shortening the response time.

5 Claims, 6 Drawing Sheets

COLLISION DETECTION DEVICE WHICH USES VARIATION OF AN INDUCTANCE OF A COIL

CROSS REFERENCE TO RELATED APPLICATION

This application is based on a Japanese Patent Application No. 2006-120594 filed on Apr. 25, 2006, the disclosure of which is incorporated herein by reference.

FIELD OF THE INVENTION

The present invention relates to a collision detection device.

BACKGROUND OF THE INVENTION

Generally, with reference to JP-7-186878A, a side impact detecting device is disclosed as a collision detection device for detecting a collision between a vehicle and an obstacle. The side impact detecting device has two cantilever beams and multiple side impact detecting sensors. The two cantilever beams are arranged in parallel in the vehicle front-rear direction between an outer panel of a door of the vehicle and an inner member of the door, in such a manner that the fixing ends of the cantilever beams are fixed to the inner member of the door.

The side impact detecting sensors are sensors which will become ON when being pressed. The side impact detecting sensors are arranged at the cantilever beam at the side of the outer panel of the vehicle door, and spaced from each other at a predetermined distance. When there occurs a collision between the vehicle door and an obstacle, the outer panel will be concaved toward the side of the inner member, so that the side impact detecting sensor attached to the cantilever beam is pressed to become ON. Thus, the collision of the vehicle can be detected.

However, in this case, even when there occurs the collision with the vehicle door, the collision cannot be detected until the side impact detecting sensor is pressed due to the deformation of the outer panel of the vehicle door. Thus, it is difficult to shorten the response time from the occurrence of the collision to the detection of the collision.

SUMMARY OF THE INVENTION

In view of the above-described disadvantage, it is an object of the present invention to provide a collision detection device to shorten the response time from an occurrence of a collision to a detection of the collision.

According to one aspect of the present invention, the collision detection device includes a coil which is arranged at an inner side of an outer panel of a body portion of a vehicle and faces the outer panel to generate a magnetic field in a direction toward the outer panel, and a collision determining unit for determining a collision with the body portion of the vehicle based on a variation of an inductance of the coil.

In this case, the coil generates the magnetic field in the direction toward the outer panel of the vehicle body portion, so that eddy current flows through the outer panel. Thus, the outer panel also generates magnetic field. The magnetic field generated by the eddy current is in interlinkage with the coil 100. When there occurs a collision between the vehicle body portion and an obstacle, the outer panel is deformed toward the side of the coil, so that the magnetic field in interlinkage with the coil varies. Thus, the inductance of the coil also varies. Therefore, the collision detection device can detect the collision with the vehicle body portion, based on the variation of the inductance of the coil. In this case, the inductance of the coil can instantly vary when the vehicle body portion is deformed, which is different from the side impact detecting sensor described above. Accordingly, the response time from the collision occurrence to the collision detection can be shortened.

According to another aspect of the present invention, the collision detection device is provided with a condenser, and a collision determining unit which determines a collision with a body portion of a vehicle based on a variation of a capacity of the condenser. The condenser is constructed of an outer panel of the body portion of the vehicle, and an electrode which is arranged at an inner side of the outer panel and faces the outer panel.

In this case, when there occurs a collision with the vehicle body portion, the outer panel is deformed to the side of the electrode so that the capacity of the condenser varies. Thus, the collision with the vehicle body portion can be detected based on the variation of the capacity of the condenser. The capacity of the condenser can instantly vary when the vehicle body portion is deformed, which is different with the side impact detecting sensor described above. Accordingly, the response time from the collision occurrence to the collision detection can be shortened.

Preferably, the resonance frequency variation detecting unit detects the variation of the resonance frequency based on a variation of an amplitude of an output voltage of the resonance circuit at a predetermined frequency.

In this case, the resonance frequency is a frequency at which the amplitude of the output voltage is maximum. When the resonance frequency of the resonance circuit varies, the amplitude of the output voltage also varies. Therefore, the variation of the resonance frequency can be substantially detected based on the variation of the amplitude of the output voltage of the resonance circuit at the predetermined frequency.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE EXAMPLED EMBODIMENTS

First Embodiment

A collision detection device 1 according to a first embodiment of the present invention will be described with reference to FIGS. 1-8. The collision detection device 1 can be suitably used as a side impact detection device for detecting a collision between an obstacle and a side surface of a vehicle, for example.

Figure 1:
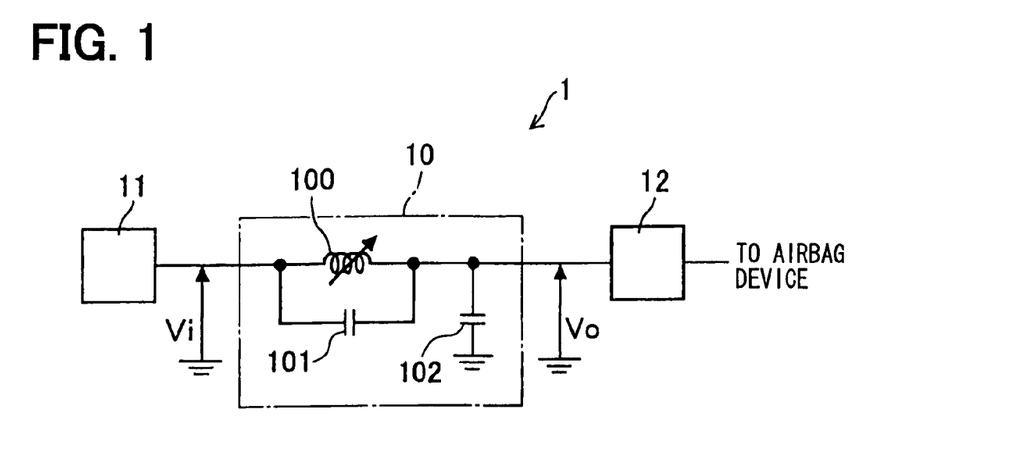
FIG. 1 is a block diagram showing a collision detection device according to a first embodiment of the present invention.

As shown in FIG. 1, the collision detection device 1 is provided with a resonance circuit 10, an oscillation circuit 11, and a resonance frequency variation detecting circuit 12.

The resonance circuit 10 has a property based on a resonance frequency FO thereof, and outputs an AC voltage Vo having an amplitude in response to a frequency of an AC voltage Vi which is inputted. The resonance circuit 10 includes a coil 100, condensers 101 and 102.

Figure 2:
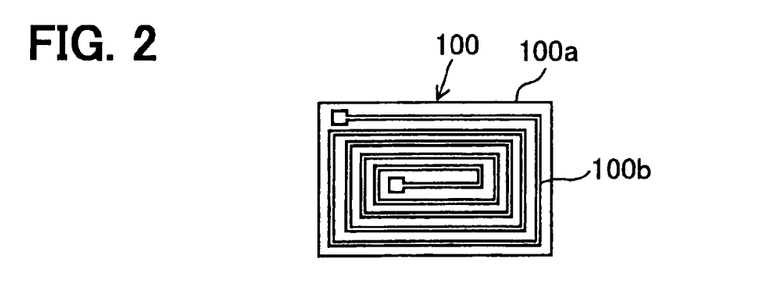
FIG. 2 is a front view showing a coil according to the first embodiment.

With reference to FIG. 2, the coil 100 includes a wiring board 100a which has a film shape and is flexible, and a spiral wiring pattern 100b arranged at the wiring board 100a. The surface of the wiring board 100a is insulated except connection portions.

Figure 3:
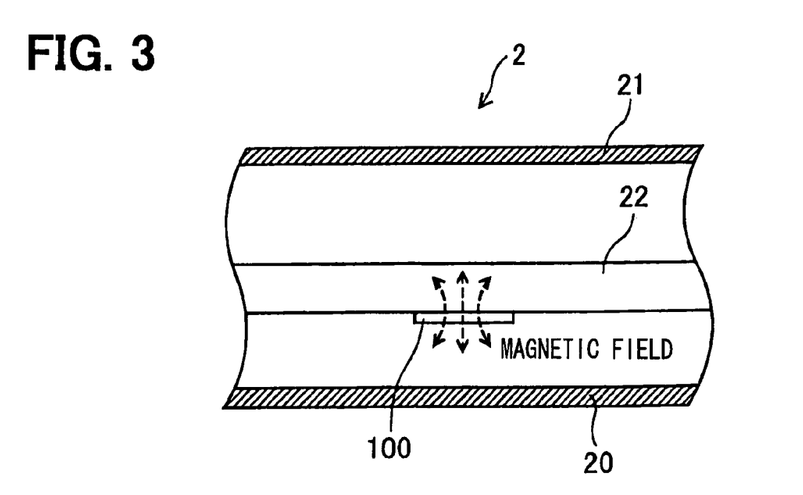
FIG. 3 is an enlarged sectional view showing a door of a vehicle when being viewed from an upper side according to the first embodiment.

As shown in FIG. 3, the coil 100 can be arranged at the inner side (i.e., side of passenger compartment of vehicle) of an outer panel 20 of a vehicle body portion 2 (vehicle chassis), and faces the outer panel 20.

For example, the coil 100 can be fixed to a resin member 22 which is arranged between the outer panel 20 and an inner panel 21 of the vehicle body 2 to generate a magnetic field in a direction toward the outer panel 20. For example, the vehicle body 2 can be constructed of a door (made of metal or the like) of the vehicle. The wiring of the coil 100 is arranged at the resonance circuit 10 (shown in FIG. 1) through wire harness (not shown).

As shown in FIG. 1, the coil 100 is connected with the condenser 101 in parallel. One of two ends of the coil 100 which are connected with the condenser 101 constructs an input terminal of the resonance circuit 10, and the other thereof is grounded through the resonance circuit 102 and constructs an output terminal. In this case, the resonance frequency FO of the resonance circuit 10 is related to an inductance Ls of the coil 100, capacitance Cs and Co of the condensers 101 and 102, and can be indicated as the following formal.

$$F0 = \frac{1}{2\pi\sqrt{Ls \cdot (Cs + Co)}} \quad (1)$$

Figure 4:
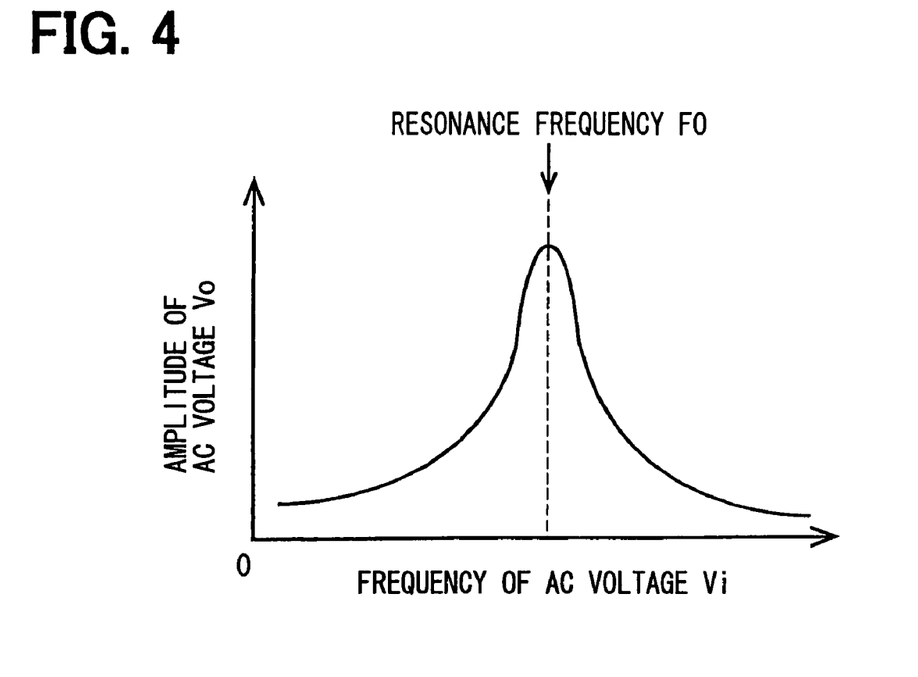
FIG. 4 is a graph showing a variation of an amplitude of an output voltage with respect to a frequency of an input voltage of a resonance circuit according to the first embodiment.

As shown in FIG. 4, the amplitude of the AC voltage Vo which is outputted from the output terminal with respect to the frequency of the AC voltage Vi which is inputted to the input terminal has a maximum value when the frequency of the AC voltage Vi is equal to the resonance frequency FO and gradually becomes small with being apart from the resonance frequency FO.

As shown in FIG. 1, the oscillation circuit 11 is provided to supply the resonance circuit 10 with the AC voltage having a predetermined frequency Fi to excite the resonance circuit 10. The output terminal of the oscillation circuit 11 is connected with the input terminal of the resonance circuit 10.

The resonance frequency variation detecting unit 12 can detect a variation of the resonance frequency FO of the resonance circuit 10, to determine a collision between the door 2 of the vehicle and an obstacle 3. The input terminal and the output terminal of the resonance frequency variation detecting unit 12 are respectively connected with the output terminal of the resonance circuit 10 and an airbag device (not shown) of the vehicle.

Next, the operation of the collision detection device 1 according to this embodiment will be described.

Figure 5:
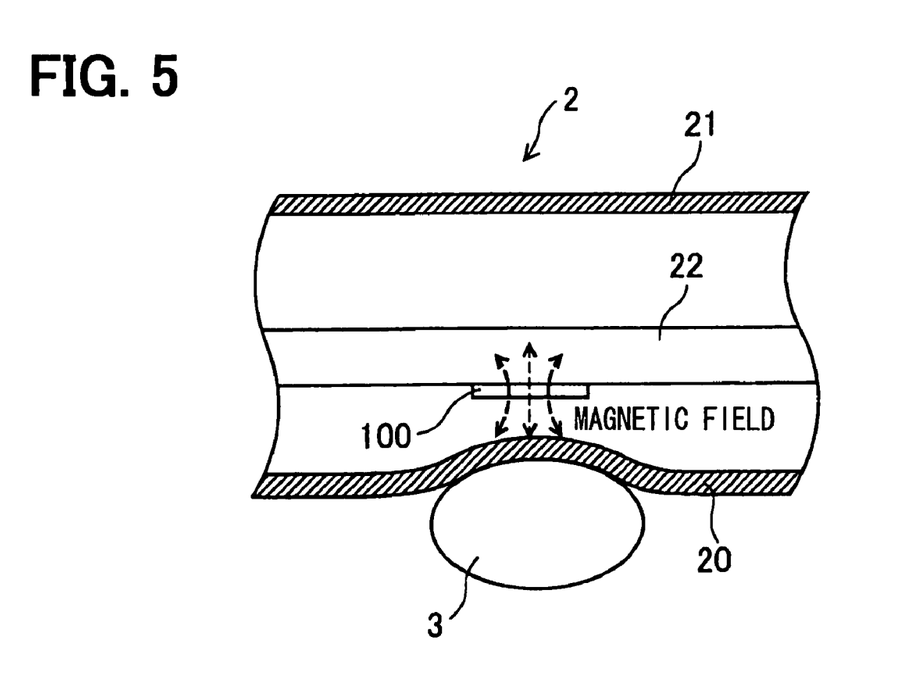
FIG. 5 is an enlarged sectional view showing the door of the vehicle at a collision when being viewed from the upper side according to the first embodiment.
Figure 6:
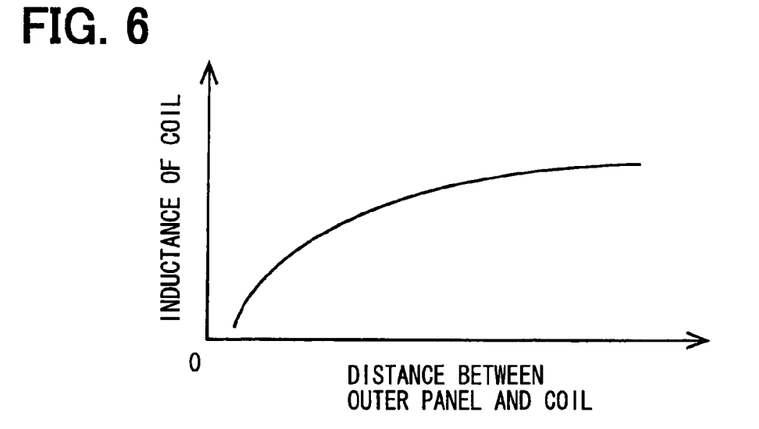
FIG. 6 is a graph showing a variation of an inductance of a coil with respect to a distance between an outer panel of the door and the coil according to the first embodiment.
Figure 7:
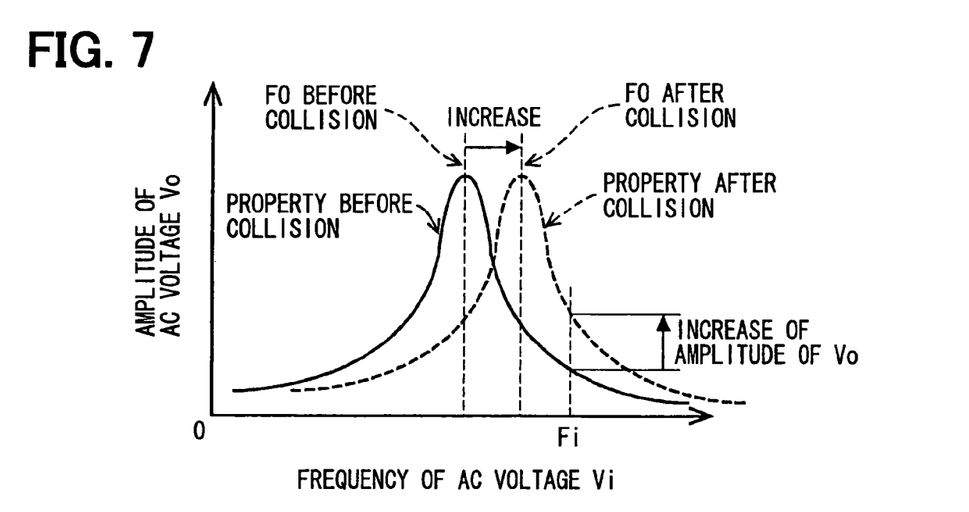
FIG. 7 is a graph showing a variation of a property of the resonance circuit before and after the collision according to the first embodiment.
Figure 8:
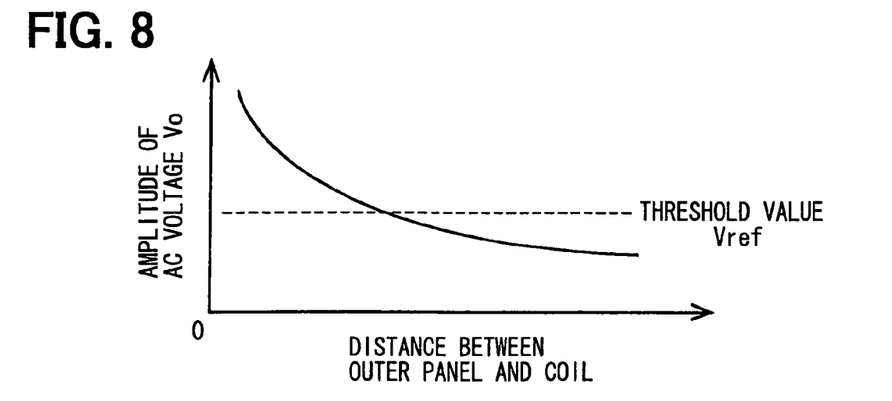
FIG. 8 is a graph showing a variation of the output voltage of the resonance circuit with respect to the distance between the outer panel of the door and the coil according to the first embodiment.

FIG. 5 is an enlarged sectional view of the vehicle door 2 when being collided and being viewed from the upper side. FIG. 6 is a graph showing a variation of the inductance Ls of the coil 100 with respect to a distance between the outer panel of the vehicle door 2 and the coil 100. FIG. 7 is a graph showing a variation of the property of the resonance circuit 10 before and after the collision. FIG. 8 is a graph showing a variation of the output voltage Vo of the resonance circuit 10 with respect to the distance between the outer panel of the vehicle door 2 and the coil 100.

As shown in FIG. 1, the oscillation circuit 11 inputs the AC voltage Vi having the predetermined frequency Fi which is higher than the resonance frequency FO of the resonance circuit 10, to the input terminal of the resonance circuit 10. In this case, as shown in FIG. 3, the coil 100 generates the magnetic field in the direction toward the outer panel 20 of the vehicle door 2. Due to the magnetic field generated by the coil 100, eddy-current flows through the outer panel 20 of the vehicle door 2, so that the outer panel 20 also generates a magnetic field (not shown).

As shown in FIG. 5, when the obstacle 3 collides with the outer panel 20 of the vehicle door 2, the outer panel 20 is deformed toward the side of the coil 100. Thus, the distance between the outer panel 20 and the coil 100 decreases. Accompanying with this, the magnetic field generated due to the eddy-current in interlinkage with the coil 100 will increase. Therefore, as shown in FIG. 6, with the decrease of the distance between the outer panel 20 and the coil 100, the inductance Ls of the coil 100 continuously and instantly decreases.

When the inductance Ls of the coil 100 decreases, as indicated in the formula (1), the resonance frequency FO of the resonance circuit 10 will increase. That is, because the obstacle 3 collides with the outer panel 20 of the vehicle door 2, the resonance frequency FO of the resonance circuit 10 increases and the property thereof shifts toward the side of the high frequency as a whole as shown in FIG. 7. Thus, the amplitude of the AC voltage Vo which is outputted will also increase with respect to the AC voltage Vi with the predetermined frequency Fi which is inputted.

As described above, the inductance Ls of the coil 100 continuously decreases. Therefore, with reference to FIG. 8, the amplitude of the AC voltage Vo outputted from the resonance circuit 10 also continuously and instantly increases in accordance with the decrease of the distance between the outer panel 20 of the vehicle door 2 and the coil 100.

In this case, the resonance circuit 10, the oscillation circuit 11, and the resonance frequency variation detecting circuit 12 construct a collision determining unit.

As shown FIG. 8, the resonance frequency variation detecting unit 12 compares the amplitude of the AC voltage Vo outputted by the resonance circuit 10 with a threshold value Vref which is beforehand set. In the case where the amplitude of the AC voltage Vo is larger than or equal to the threshold value Vref, it is determined that there occurs a collision between the vehicle door 2 and the obstacle 3 because the distance between the outer panel 20 of the vehicle door 2 and the coil 100 is smaller than or equal to the predetermined distance. Thus, a collision signal is outputted to the airbag device, so that the airbag device can be actuated to protect a passenger or a pedestrian, for example.

According to the first embodiment, the response time from the occurrence of the collision between the vehicle door 2 and the obstacle 3 to the detection of the collision can be shortened. When there occurs the collision between the outer panel 20 of the vehicle door 2 and the obstacle 3, the distance between the outer panel 20 and the coil 100 will decrease. The inductance Ls of the coil 100 continuously and instantly decreases in accordance with the decrease of the distance between the outer panel 20 and the coil 100. Because the decrease of the inductance Ls of the coil 100 can be detected by the resonance circuit 10, the oscillation circuit 11 and the resonance frequency variation detecting unit 12, the response time from the collision occurrence to the collision detection can be shortened.

Moreover, according to the first embodiment, the decrease of the inductance Ls of the coil 100 can be substantially detected as the increase of the resonance frequency of the resonance circuit 10. In this case, the resonance circuit 10 is provided with the coil 100, and the resonance frequency FO thereof increases because of the decrease of the inductance Ls of the coil 100. Therefore, the decrease of the inductance Ls of the coil 100 can be substantially detected by the resonance frequency variation detecting unit 12, as the increase of the resonance frequency FO.

Furthermore, the increase of the resonance frequency FO of the resonance circuit 10 can be substantially detected. When the resonance frequency FO of the resonance circuit 10 increases, the amplitude of the AC voltage Vo which is outputted also increases with respect to the AC voltage Vi having the predetermined frequency Fi which is inputted. Therefore, the increase of the resonance frequency FO can be substantially detected from the increase of the amplitude of the AC voltage Vo which is outputted by the resonance circuit 10 at the predetermined frequency Fi.

According to the first embodiment, the coil 100 is provided with the wiring board 100a which has the film shape and is flexible, so that that the coil 100 can be arranged even at a small gap. Alternatively, a general winding coil can be also arranged if the mounting performance and the response performance thereof are satisfactory.

Second Embodiment

Figure 9:
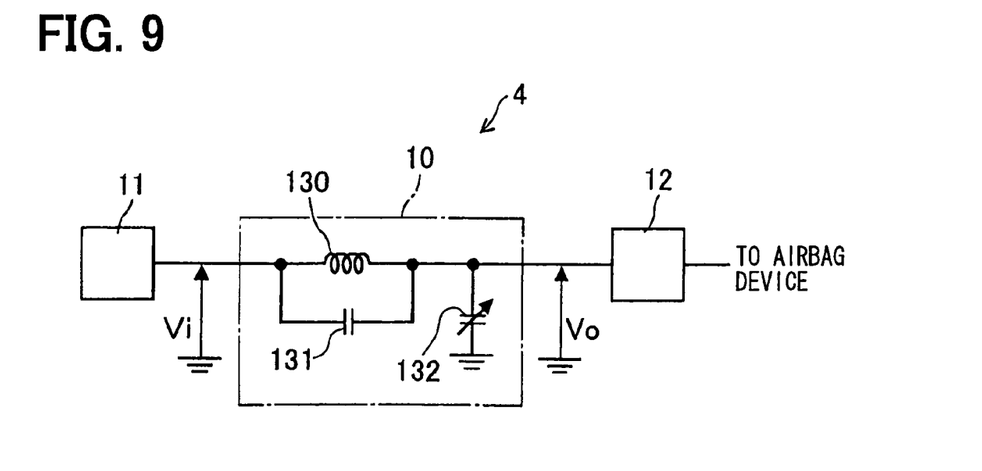
FIG. 9 is a block diagram showing a collision detection device according to a second embodiment of the present invention.
Figure 10:
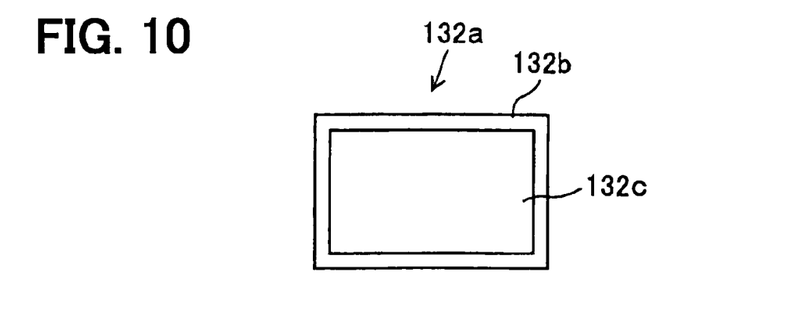
FIG. 10 is a front view showing an electrode of a condenser according to the second embodiment.
Figure 11:
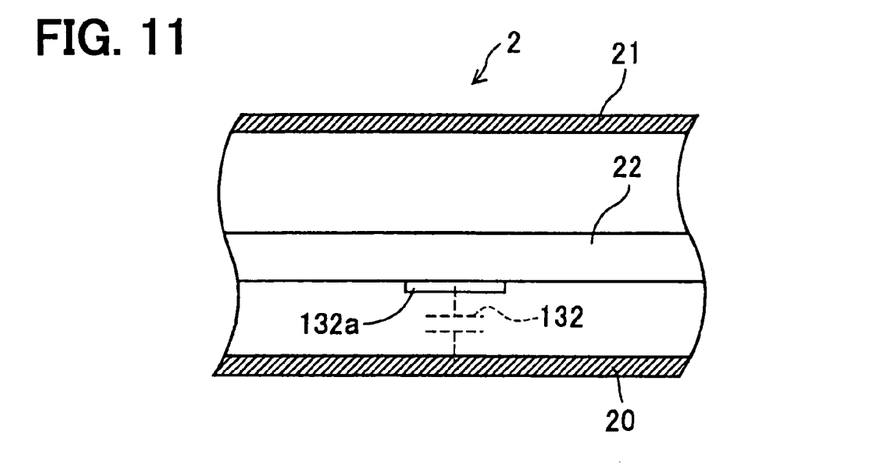
FIG. 11 is an enlarged section view showing a door of a vehicle when being viewed from an upper side according to the second embodiment.

The collision detection device 1 according to a second embodiment of the present invention will be described with reference to FIGS. 9-15. FIG. 9 is a block diagram showing the collision detection device 1. FIG. 10 is a front view showing an electrode 132a of a condenser 132. FIG. 11 is an enlarged section view showing the vehicle door 2 when being viewed from the upper side.

The collision detection device 1 according to the second embodiment is provided with the resonance circuit 10 having the different construction from that of the first embodiment.

As shown in FIG. 9, the collision detection device 1 has the resonance circuit 10, the oscillation circuit 11 and the resonance frequency variation detecting unit 12.

The resonance circuit 10 includes a coil 130, and condensers 131 and 132. As shown in FIG. 10, the one electrode 132a of the condenser 132 is constructed of a wiring board 132b which has a film shape and is flexible, and a wiring pattern 132c (having substantial rectangle shape, for example) which is arranged at the wiring board 132b.

The surface of the wiring board 132b is insulated except connection portions. As shown in FIG. 11, the electrode 132a is fixed to the resin member 22 which is arranged between the outer panel 20 (made of metal or the like) of the vehicle door 2 and the inner panel 21, in such a manner that the electrode 132a faces the outer panel 20 which contracts the other electrode of the condenser 132. The wiring of the electrode 132a is arranged to the resonance circuit 10 (shown in FIG. 9) through a wire harness (not shown). The outer panel 20 is grounded.

As shown in FIG. 9, the condenser 131 is connected with the coil 130 in parallel. One of two ends of the coil 130 which are connected with the condenser 131 constructs an input terminal of the resonance circuit 10, and the other thereof is grounded through the condenser 132 and constructs an output terminal.

In this case, the resonance frequency FO of the resonance circuit 10 is determined based on the formula (1), similarly to the first embodiment. Moreover, at the resonance circuit 10, the amplitude of the AC voltage Vo which is outputted from the output terminal the resonance circuit 10 with respect to the frequency of the AC voltage Vi inputted to the input terminal has the property shown in FIG. 4, similar to the first embodiment.

Next, the operation of the collision detection device 1 according to this embodiment will be described.

Figure 12:
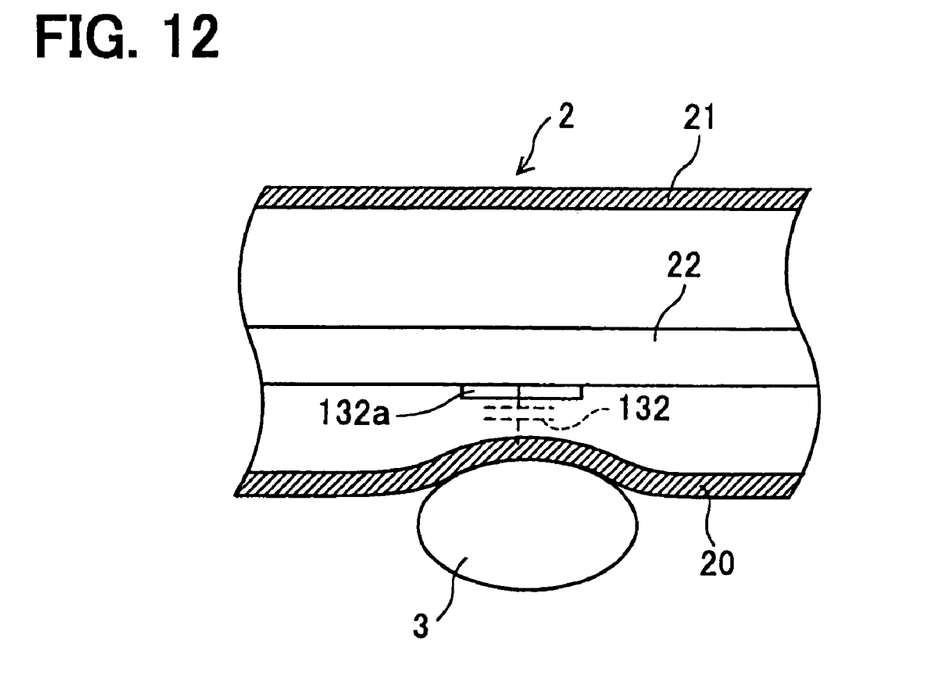
FIG. 12 is an enlarged sectional view showing the door at the collision when being viewed from the upper side according to the second embodiment.
Figure 13:
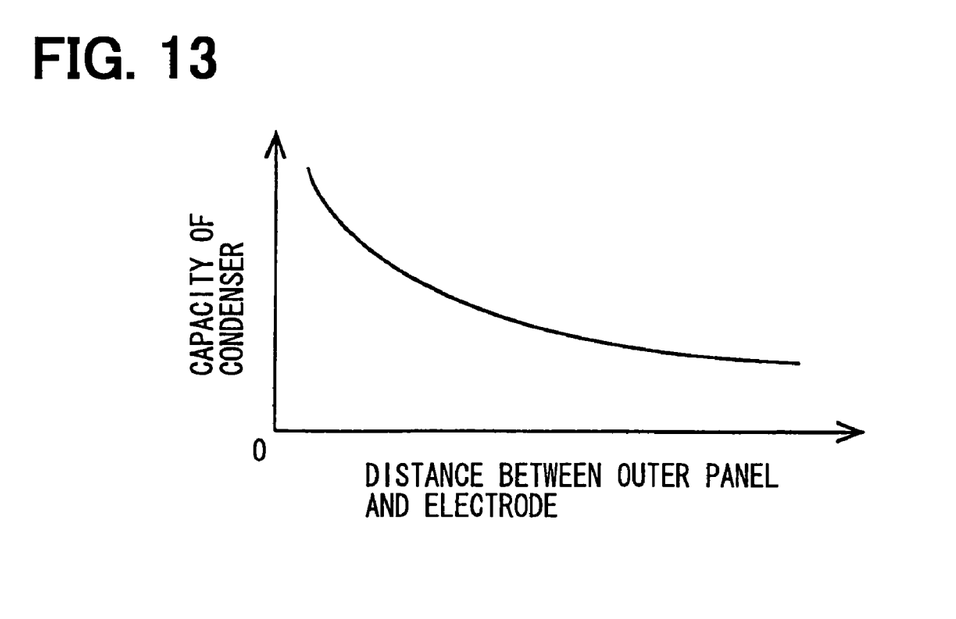
FIG. 13 is a graph showing a variation of a capacity of the condenser with respect to a distance between an outer panel of the door and the electrode of the condenser according to the second embodiment.
Figure 14:
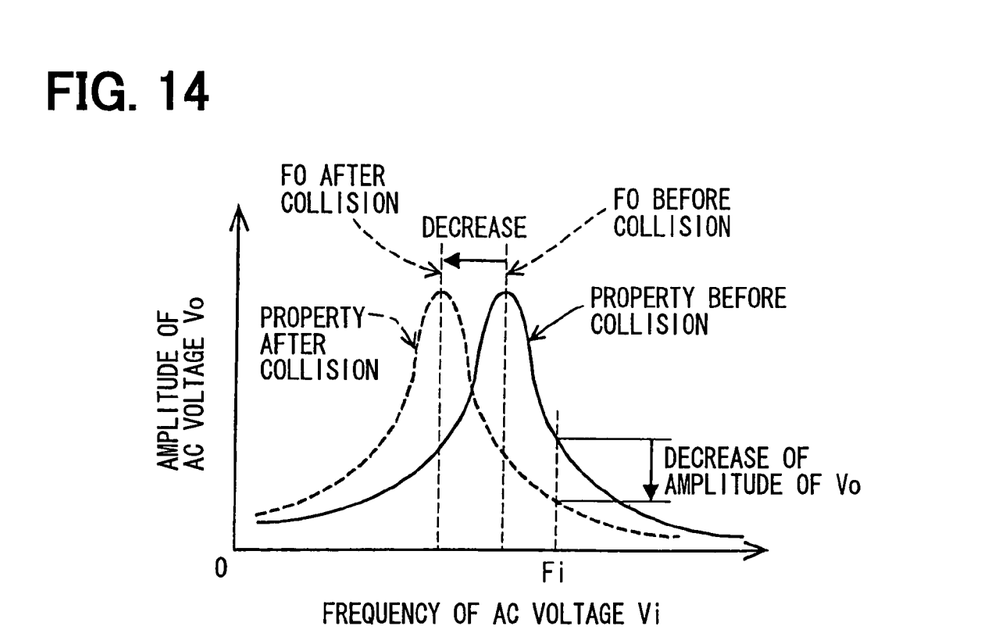
FIG. 14 is a graph showing a variation of a property of a resonance circuit before and after the collision according to the second embodiment.
Figure 15:
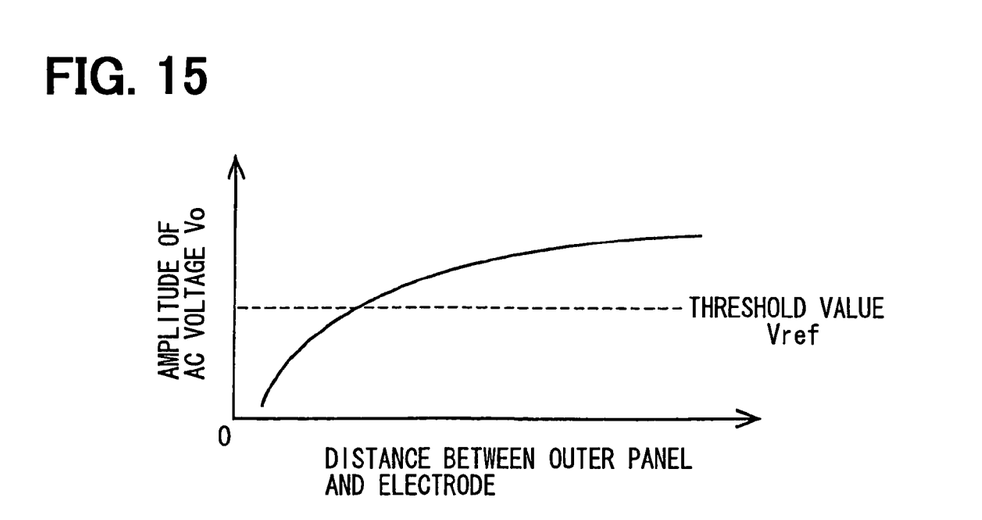
FIG. 15 is a graph showing a variation of an output voltage of the resonance circuit with respect to the distance between the outer panel of the door and the electrode of the condenser according to the second embodiment.

FIG. 12 is an enlarged sectional view showing the vehicle door 2 at the collision when being viewed from the upper side. FIG. 13 is a graph showing a variation of the capacity Co of the condenser 132 with respect to the distance between the outer panel 20 of the vehicle door 2 and the electrode 132a of the condenser 132. FIG. 14 is a graph showing a variation of the property of the resonance circuit 10 before and after the collision. FIG. 15 is a graph showing a variation of the output voltage Vo of the resonance circuit 10 with respect to the distance between the outer panel 20 of the vehicle door 2 and the electrode 132a of the condenser 132.

As show in FIG. 9, the oscillation circuit 11 inputs the AC voltage Vi having the predetermined frequency Fi which is higher than the resonance frequency FO of the resonance circuit 10, to the input terminal of the resonance circuit 10. In this case, as shown in FIG. 11, the condenser 132 is constructed of the outer panel 20 of the vehicle door 2 made of the metal and the electrode 132a which face each other.

In this case, as shown in FIG. 12, when there occurs a collision between the outer panel 20 of the vehicle door 2 and the obstacle 3, the outer panel 20 is deformed toward the side of the electrode 132a. Thus, the distance between the outer panel 20 and the electrode 132a decreases. Therefore, as shown in FIG. 13, with the decrease of the distance between the outer panel 20 and the electrode 132a, the capacity Co of the condenser 132 continuously and instantly increases.

When the capacity Co of the condenser 132 increases, the resonance frequency FO of the resonance circuit 10 decreases with reference to the formula (1). That is, because the obstacle 3 collides with the outer panel 20 of the vehicle door 2, the resonance frequency FO of the resonance circuit 10 decreases and the property thereof shifts toward the side of the low frequency as a whole as shown in FIG. 14. Thus, the amplitude of the AC voltage Vo which is outputted will also decrease with respect to the AC voltage Vi having the predetermined frequency Fi which is inputted.

As described above, the inductance Ls of the condenser 132 continuously decreases. Therefore, with reference to FIG. 15, the amplitude of the AC voltage Vo outputted from the resonance circuit 10 also continuously and instantly decreases in accordance with the decrease of the distance between the outer panel 20 of the vehicle door 2 and the electrode 132a.

In this case, the resonance circuit 10, the oscillation circuit 11, and the resonance frequency variation detecting circuit 12 construct the collision determining unit.

As shown FIG. 15, the resonance frequency variation detecting unit 12 compares the amplitude of the AC voltage Vo outputted by the resonance circuit 10 with the threshold value Vref which is beforehand set. In the case where the amplitude of the AC voltage is smaller than or equal to the threshold value Vref, it is determined that there occurs a collision between the vehicle door 2 and the obstacle 3 because the distance between the outer panel 20 of the vehicle door 2 and the electrode 132a is smaller than or equal to the predetermined distance. Thus, a collision signal is outputted to the airbag device, so that the airbag device is actuated, for example.

According to the second embodiment, the response time from the collision occurrence between the vehicle door 2 and the obstacle 3 to the collision detection can be shortened. When there occurs the collision between the outer panel 20 of the 2 and the obstacle 3, the distance between the outer panel 20 and the electrode 132a decreases. The capacity of the condenser 132 can continuously and instantly increase in accordance with the decrease of the distance between the outer panel 20 and the electrode 132a. Because the increase of the capacity Co of the condenser 132 can be detected by the resonance circuit 10, the oscillation circuit 11 and the resonance frequency variation detecting unit 12, the response time from the collision occurrence to the collision detection can be shortened.

Moreover, according to the second embodiment, the increase of the capacity Co of the condenser 132 can be substantially detected as the decrease of the resonance frequency FO of the resonance circuit 10. In this case, the resonance circuit 10 is provided with the condenser 132, and the resonance frequency FO thereof decreases because of the increase of the capacity Co of the condenser 132. Therefore, the increase of the capacity Co of the condenser 132 can be substantially detected by the resonance frequency variation detecting unit 12, as the decrease of the resonance frequency FO.

Furthermore, the decrease of the resonance frequency FO of the resonance circuit 10 can be substantially detected. When the resonance frequency FO of the resonance circuit 10 decreases, the amplitude of the AC voltage Vo which is outputted also decreases with respect to the AC voltage Vi having the predetermined frequency Fi which is inputted. Therefore, the decrease of the resonance frequency FO can be substantially detected from the decrease of the amplitude of the AC voltage Vo which is outputted by the resonance circuit 10 at the predetermined frequency Fi.

According to the second embodiment, the electrode 132a is provided with the wiring board 132b which has the film shape and is flexible, so that the mounting performance thereof can be improved.

About the collision detection device 1, what has not described in the second embodiment can be the same as the first embodiment.

What is claimed is:

1. A collision detection device comprising:
    a coil which is arranged at an inner side of an outer panel of a body portion of a vehicle and faces the outer panel to generate a magnetic field in a direction toward the outer panel; and
    a collision determining unit determining a collision with the body portion of the vehicle based on a variation of an inductance of the coil caused by a variation of a distance between the coil and the outer panel; wherein
    the collision determining unit is constructed of a resonance circuit including the coil, an oscillation circuit for exciting the resonance circuit, and a resonance frequency variation detecting unit detecting a variation of a resonance frequency of the resonance circuit related to the inductance of a coil.

2. The collision detection device according to claim 1, wherein
    the coil includes a wiring board and a wiring pattern which is arranged at the wiring board.

3. The collision detection device according to claim 1, wherein
    the coil is arranged at the inner side of the outer panel of a door of the vehicle.

4. The collision detection device according to claim 1, wherein
    the resonance frequency variation detecting unit detects the variation of the resonance frequency based on a variation of an amplitude of an output voltage of the resonance circuit at a predetermined frequency.

5. The collision detection device according to claim 1, wherein the outer panel is made of a metal.

* * * * *